United States Patent
Jhong et al.

(10) Patent No.: US 6,653,728 B1
(45) Date of Patent: Nov. 25, 2003

(54) TRAY FOR BALL GRID ARRAY SEMICONDUCTOR PACKAGES

(75) Inventors: Jheng-Xian Jhong, Taichung (TW); G. F. Chen, Taichung (TW)

(73) Assignee: Siliconware Precision Industries Co., Ltd., Taiwan (TW)

( * ) Notice: Subject to any disclaimer, the term of this patent is extended or adjusted under 35 U.S.C. 154(b) by 0 days.

(21) Appl. No.: 10/334,557

(22) Filed: Dec. 30, 2002

(30) Foreign Application Priority Data

Nov. 4, 2002 (TW) ........................... 91132462 A

(51) Int. Cl.⁷ ............................................. H01L 23/049
(52) U.S. Cl. ..................... 257/697; 257/773; 257/738
(58) Field of Search ............................ 257/697, 773, 257/738

(56) References Cited

U.S. PATENT DOCUMENTS

| | | | |
|---|---|---|---|
| 5,400,904 A | 3/1995 | Maston, III et al. ........ 206/329 |
| 5,541,449 A | * | 7/1996 | Crane, Jr. et al. |
| 5,729,051 A | * | 3/1998 | Nakamura |
| 6,116,427 A | 9/2000 | Wu et al. .................... 206/706 |
| 6,264,037 B1 | 7/2001 | Maston, III et al. ........ 206/725 |
| 6,559,537 B1 | * | 5/2003 | Bolken et al. |

* cited by examiner

*Primary Examiner*—Stephen D. Meier
(74) *Attorney, Agent, or Firm*—Peter F. Corless; Steven M. Jensen; Edwards & Angell, LLP

(57) ABSTRACT

A tray for ball grid array (BGA) semiconductor packages is provided, composed of a body, protruding portions and positioning portions. The body is formed with a plurality of recessed cavities, and the protruding portions are formed in the recessed cavities corresponding to area free of solder balls on the semiconductor packages to come into contact with the semiconductor packages; this does not require the use of flanges formed in a conventional tray to support a quite narrow peripheral portion of a semiconductor package, thereby preventing cracks of solder balls and assuring structural integrity and electrical-connection quality of the semiconductor packages. When the trays are vertically stacked, a positioning portion of an upper tray is engaged with a gap between an inner side wall of a recessed cavity and a semiconductor package received in a lower tray, so as to securely position the semiconductor packages accommodated by the lower tray.

15 Claims, 5 Drawing Sheets

TRAY FOR BALL GRID ARRAY SEMICONDUCTOR PACKAGES

FIELD OF THE INVENTION

The present invention relates to trays for semiconductor packages, and more particularly, to a tray for storage and transportation of ball grid array (BGA) semiconductor packages.

BACKGROUND OF THE INVENTION

A BGA semiconductor package is characterized in mounting at least a chip on a surface of a substrate, and implanting a plurality of solder balls on an opposing surface of the substrate; these solder balls act as input/output connections of the semiconductor package to allow the chip to be electrically connected to an external device such as printed circuit board (PCB) via the solder balls.

Generally, a plurality of fabricated BGA semiconductor packages are simultaneously stored or transported by means of a tray to be subject to subsequent processes such as functional tests. As semiconductor packages are structured more complicated and incorporated with more delicate components or elements, they may be more easily damaged by external impact or influence such as mechanical shock, and therefore, the design for a tray is critical for allowing semiconductor packages to be properly supported and protected by the tray so as to assure structural integrity of the semiconductor packages.

U.S. Pat. Nos. 5,400,904 and 6,116,427 disclose a tray 1, as shown in FIG. 5A, having a body 10 formed with a plurality of recessed cavities 11 for receiving semiconductor packages 12 therein respectively, and the recessed cavities 11 are each dimensioned to properly accommodate the corresponding semiconductor package 12. Moreover, an inner side wall 110 of the recessed cavity 11 is formed with a plurality of flanges 13 for supporting the semiconductor package 12, wherein a substrate 14 of the semiconductor package 12 is implanted on a surface thereof with a plurality of solder balls 15, and the semiconductor package 12 is received in the recessed cavity 11 in a manner that the solder balls 15 are directed toward a bottom surface 111 of the recessed cavity 11 and the flanges 13 come into contact with a peripheral portion of the surface of the substrate 14 having the solder balls 15 without interfering with arrangement of the solder balls 15, such that the semiconductor package 12 can be positioned within the recessed cavity 11 and supported by the flanges 13 of the tray 1.

However, as the peripheral portion of the substrate 14 in contact with the flanges 13 of the above tray 1 is quite narrow (e.g. 0.7 mm or even smaller), by dimensional inaccuracy of the flanges 13 in fabrication, as shown in FIG. 5B, the flanges 13 may possibly abut against or press on nearby solder balls 15 that may be damaged with cracks, thereby undesirably affecting structure and electrical-connection quality of the semiconductor package 12. Moreover, the semiconductor package 12 received in the recessed cavity 11 of the tray 1 is merely supported by the flanges 13; during movement of the tray 1 or performance of subsequent processes such as functional tests, the semiconductor package 12 may be shifted in position or dislocated to thereby adversely affect process or test performance, and this unsatisfactory positioning problem may also cause structural damage to the semiconductor package 12 due to impact, thereby degrading yield of package products.

Other related prior arts such as U.S. Pat. Nos. 5,890,599 and 6,264,037 similarly disclose a tray for semiconductor packages, but still fail to solve the above structural damage problem in terms of solder-ball cracking and unsatisfactory positioning for the semiconductor packages.

Therefore, the problem to be solved herein is to provide a tray for semiconductor packages, so as to assure structural integrity of the semiconductor packages accommodated by the tray.

SUMMARY OF THE INVENTION

A primary objective of the present invention is to provide a tray for ball grid array (BGA) semiconductor packages for accommodate a plurality of semiconductor packages, which can maintain structural integrity of the semiconductor packages without damaging solder balls thereof, and assure electrical-connection quality of the semiconductor packages.

Another objective of the invention is to provide a tray for BGA semiconductor packages for accommodate a plurality of semiconductor packages, which can securely position and support the semiconductor packages.

In accordance with the above and other objectives, the present invention proposes a tray for BGA semiconductor packages, with a surface of a BGA semiconductor package being defined with a ball-implanting area where a plurality of solder balls are array-arranged and a non-ball-implanting area free of the solder balls, the tray comprising: a body having an upper surface and a lower surface opposed to the upper surface, the upper surface being formed with a plurality of downwardly recessed cavities, for allowing the semiconductor packages to be received in the recessed cavities with the surfaces of the semiconductor packages having the solder balls facing toward bottom surfaces of the recessed cavities; at least a protruding portion formed on the bottom surface of each of the recessed cavities, and corresponding in position to the non-ball-implanting area of the surface of the corresponding semiconductor package, so as to allow the protruding portion to support the semiconductor package received in the corresponding recessed cavity; and at least a positioning portion formed on the lower surface of the body, and corresponding in position to a gap between an inner side wall of each of the recessed cavities and the semiconductor package received in the corresponding recessed cavity; when the trays incorporated with the semiconductor packages are vertically stacked, a positioning portion of an upper tray is engaged with a gap between an inner side wall of a recessed cavity and a semiconductor package received in the recessed cavity of a lower tray, so as to securely position the semiconductor package accommodated by the lower tray.

In the use of the above tray for storage and transportation of a plurality of semiconductor packages, the semiconductor packages are respectively received in recessed cavities of the tray, with non-ball-implanting areas thereof free of solder balls being supported by protruding portions formed on bottom surfaces of the recessed cavities; this does not require the use of flanges formed on an inner side wall of a recessed cavity of a conventional tray to support a quite narrow peripheral portion of a chip carrier (such as a substrate) of a semiconductor package received in the recessed cavity, thereby preventing cracks of solder balls being pressed by the flanges. Therefore, structural integrity and electrical-connection quality of the semiconductor packages can be assured through the use of the above tray for accommodating the semiconductor packages. Moreover, when the trays are vertically stacked, a positioning portion of an upper tray is engaged with a gap between an inner side wall of a recessed cavity and a semiconductor package received in the recessed cavity of a lower tray, so as to securely position the semiconductor packages accommodated by the lower tray without the occurrence of positional shift or dislocation of the semiconductor packages that may adversely affect performance of subsequent fabrication processes, and also prevent the semiconductor packages from being damaged by unsatisfactory positioning.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

The preferred embodiments of a tray for ball grid array (BGA) semiconductor packages proposed in the present invention are described with reference to FIGS. 1A–1C, 2, 3A–3C and 4A–4C.

First Preferred Embodiment

Figure 1A:
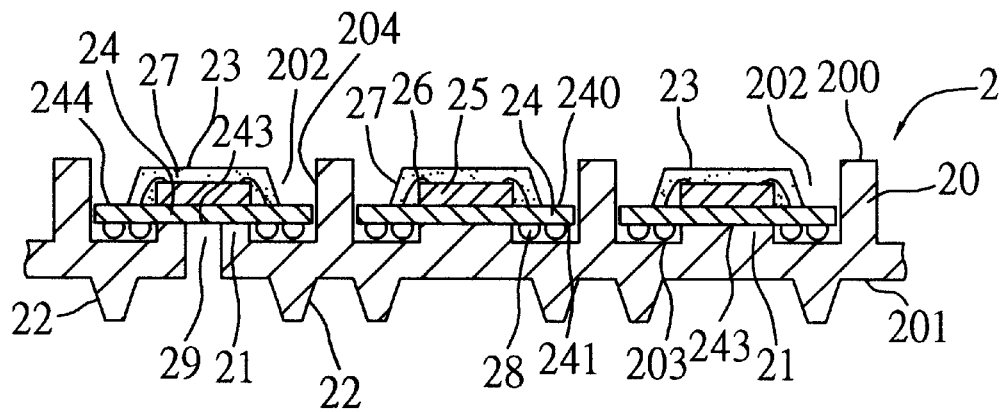
FIG. 1A is a cross-sectional view of a tray incorporated with semiconductor packages according to a first preferred embodiment of the invention.
Figure 1B:
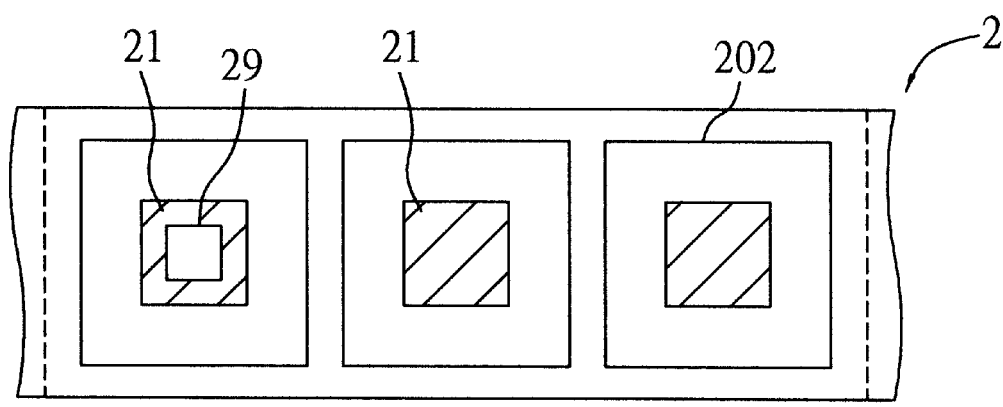
FIG. 1B is a top view of the tray shown in FIG. 1A.

As shown in FIGS. 1A and 1B, a tray 2 for BGA semiconductor packages according to a first preferred embodiment of the invention is composed of a body 20, a plurality of protruding portions 21 and a plurality of positioning portions 22. The body 20 is shaped as a flat plate, having an upper surface 200 and a lower surface 201 opposed to the upper surface 200, wherein the upper surface 200 is formed with a plurality of downwardly recessed cavities 202, for allowing a BGA semiconductor package 23 to be received in each of the recessed cavities 202, and the recessed cavity 202 is dimensioned sufficiently to accommodate the entire semiconductor package 23 therein.

Figure 1C:
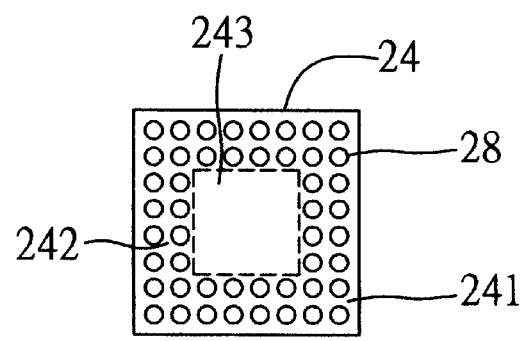
FIG. 1C is a bottom view of the tray incorporated with semiconductor packages shown in FIG. 1A.

The BGA semiconductor package 23 uses a chip carrier 24 for mounting a chip 25 on an upper surface 240 thereof, and is formed with a plurality of bonding wires 26 that electrically connect the chip 25 to the chip carrier 24, allowing the chip 25 and the bonding wires 26 to be encapsulated by an encapsulant 27 applied over the upper surface 240 of the chip carrier 24; as shown in FIG. 1C, a lower surface 241 of the chip carrier 24 is defined with a ball-implanting area 242 for implanting a plurality of solder balls 28 thereon and a non-ball-implanting area 243 free of the solder balls 28. In this embodiment, as shown in FIG. 1C, the ball-implanting area 242 having the solder balls 28 is situated at a peripheral portion of the lower surface 241 of the chip carrier 24, and the non-ball-implanting area 243 is situated at a central portion of lower surface 241 to be subsequently in contact with the protruding portion 21 of the tray 2.

The plurality of protruding portions 21 are formed in the recessed cavities 202 in a manner that, one protruding portion 21 upwardly protrudes on a bottom surface 203 of each of the recessed cavities 202, and corresponds in position to the non-ball-implanting area 243 (i.e. the central portion) on the lower surface 241 of the chip carrier 24, so as to allow the BGA semiconductor package 23 to be received in the corresponding recessed cavity 202, with the solder balls 28 thereof facing toward the bottom surface 203 of the recessed cavity 202 and the non-ball-implanting area 243 of the chip carrier 24 abutting against the protruding portion 21 in the recessed cavity 202. The protruding portion 21 is larger in height than the solder balls 28 of the semiconductor package 23, and depth of the recessed cavity 202 is greater than the sum in height of the semiconductor package 23 and the protruding portion 21, such that the semiconductor package 23 can be comfortably disposed within the recessed cavity 202 whose bottom surface 203 would not touch the solder balls 28.

The plurality of positioning portions 22 are formed on the lower surface 201 of the body 20, wherein each of the position portions 22 corresponds in position to a gap between an inner side wall 204 of each of the recessed cavities 202 and the semiconductor package 23 received in the corresponding recessed cavity 202; that is, the position portion 22 corresponds to a peripheral portion 244 free of the encapsulant 27 formed on the upper surface 240 of the chip carrier 24.

Moreover, the bottom surface 203 of the recessed cavity 202 may be formed with at least an opening 29 penetrating through the body 20; as shown in FIGS. 1A and 1B, the opening 29 can be formed at the protruding portion 21 and penetrates through the same, to thereby allow the non-ball-implanting area 243 of the semiconductor package 23 in contact with the protruding portion 21 to be partly exposed to the opening 29; this arrangement makes the semiconductor package 23 accommodated by the tray 2 to be partly exposed, thereby helping reduce material usage and costs for the tray 2.

Figure 2:
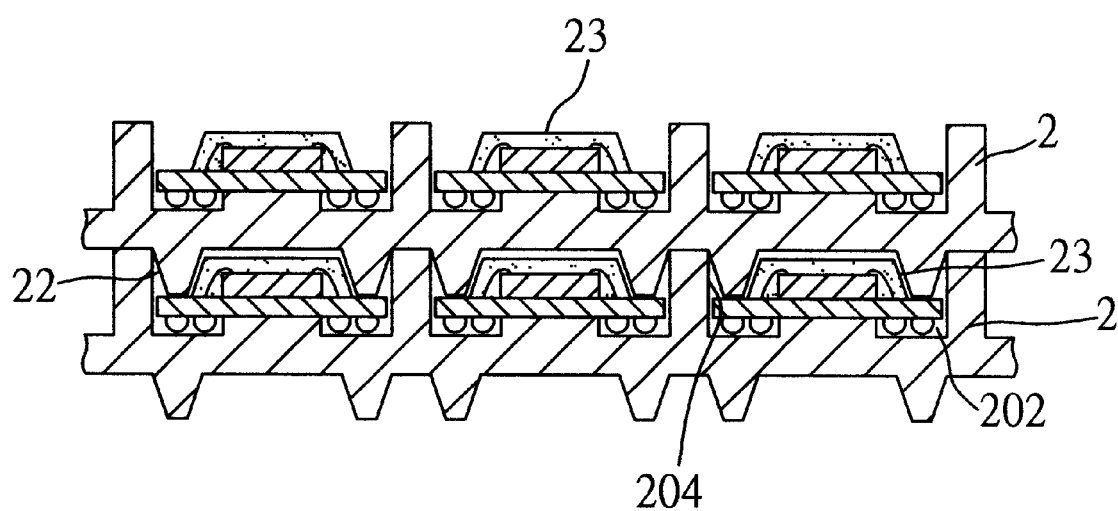
FIG. 2 is a cross-sectional view of vertically stacked trays shown in FIG. 1A.

As shown in FIG. 2, when the above trays 2 incorporated with a plurality of the semiconductor packages 23 are vertically stacked, a positioning portion 22 of an upper tray 2 is engaged with a gap between an inner side wall 204 of a recessed cavity 202 and a semiconductor package 23 received in the recessed cavity 202 of a lower tray 2, so as to securely position the semiconductor packages 23 accommodated by the lower tray 2 without the occurrence of positional shift or dislocation of the semiconductor packages 23 that may adversely affect performance of subsequent fabrication processes.

Second Preferred Embodiment

Figure 3A:
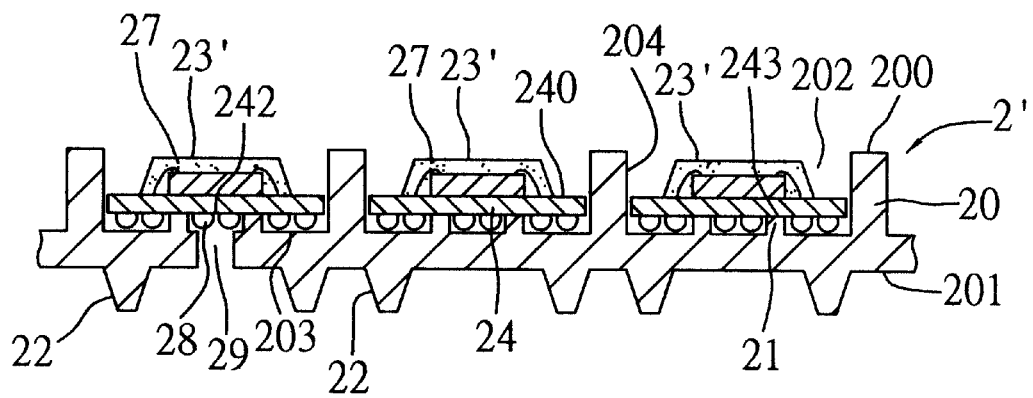
FIG. 3A is a cross-sectional view of the tray incorporated with semiconductor packages according to a second preferred embodiment of the invention.
Figure 3B:
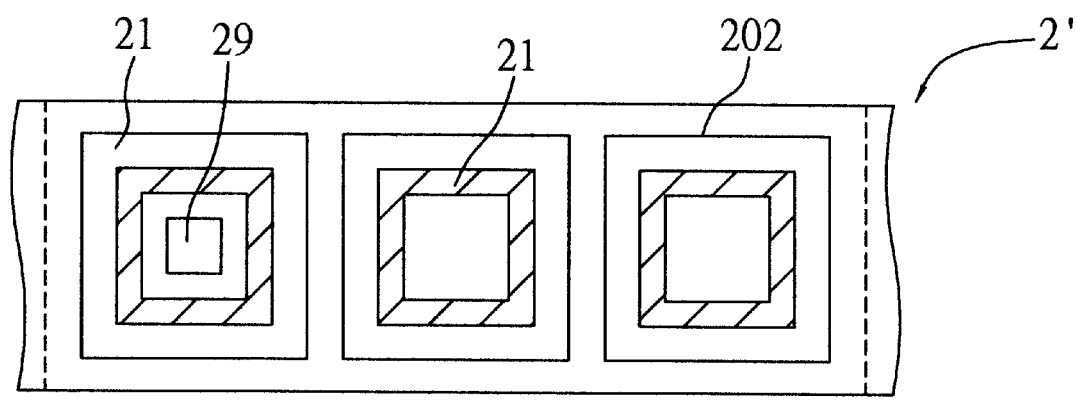
FIG. 3B is a top view of the tray shown in FIG. 3A.

FIGS. 3A and 3B illustrate a tray 2' according to a second preferred embodiment of the invention; this tray 2' is similar in structure to the above tray 2 of the first preferred embodiment, and thereby same elements are designated by the same reference numerals as those used in the above embodiment.

As shown in the drawings, the tray 2' of this embodiment is structurally similar to the above tray 2, and composed of the body 20, protruding portions 21 and positioning portions 22, wherein a plurality of downwardly recessed cavities 202 are formed on an upper surface 200 of the body 20 for receiving semiconductor packages 23' therein, and the positioning portions 22 are formed on a lower surface 201 of the body 20 and each corresponds in position to a gap between an inner side wall 204 of each of the recessed cavities 202 and the semiconductor package 23' received within the corresponding recessed cavity 202.

Figure 3C:
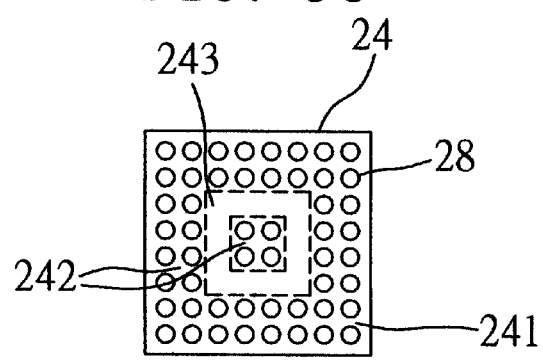
FIG. 3C is a bottom view of the tray incorporated with semiconductor packages shown in FIG. 3A.

The semiconductor package 23' accommodated by the tray 2' has different arrangement of a ball-implanting area 242 and a non-ball-implanting area 243 from the semiconductor package 23 used in the above first embodiment. As shown in FIG. 3C, the ball-implanting area 242 bonded with solder balls 28 of the semiconductor package 23' is situated at peripheral and central portions of an lower surface 241 of a chip carrier 24, and the non-ball-implanting area 243 is thereby situated between the peripheral and central portions of the lower surface 241 to be substantially of a frame shape, allowing the protruding portion 21 to formed on a bottom surface 203 of each of the recessed cavities 202 and correspond in position to the frame-shaped non-ball-implanting area 246, such that the protruding portion 21 would be substantially of a frame shape (as shown in FIG. 3B, but not limited to this) and come into contact with the semiconductor package 23'.

As shown in FIGS. 3A and 3B, the bottom surface 203 of the recessed cavity 202 may be formed with at least an opening 29 penetrating through the body 20, and the opening 29 may correspond in position to the central ball-implanting area 242 of the semiconductor package 23' to thereby partly expose the solder balls 28.

Third Preferred Embodiment

Figure 4A:
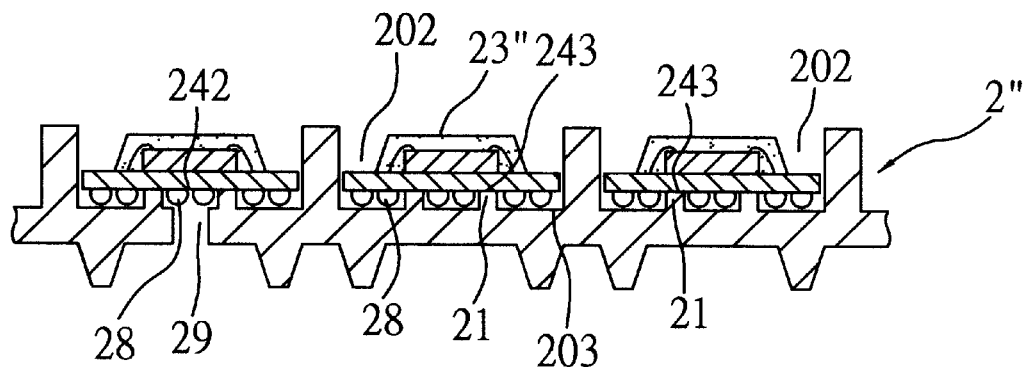
FIG. 4A is a cross-sectional view of the tray incorporated with semiconductor packages according to a third preferred embodiment of the invention.
Figure 4B:
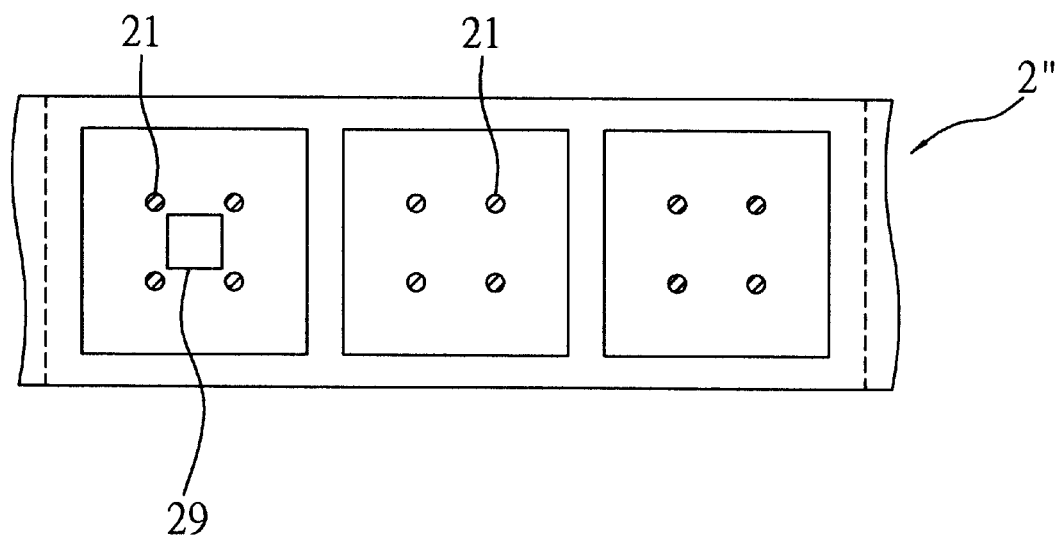
FIG. 4B is a top view of the tray shown in FIG. 4A.

FIGS. 4A and 4B illustrate a tray 2" according to a third preferred embodiment of the invention.

As shown in the drawings, the tray 2" of this embodiment is similar in structure to the tray 2' of the above second preferred embodiment, with the difference in that a plurality of protruding portions 21 are formed in each recessed cavity 202 of a body 20 of the tray 2".

Figure 4C:
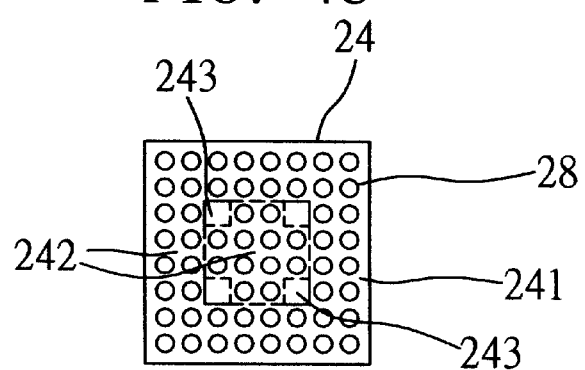
FIG. 4C is a bottom view of the tray incorporated with semiconductor packages shown in FIG. 4A.
Figure 5A:
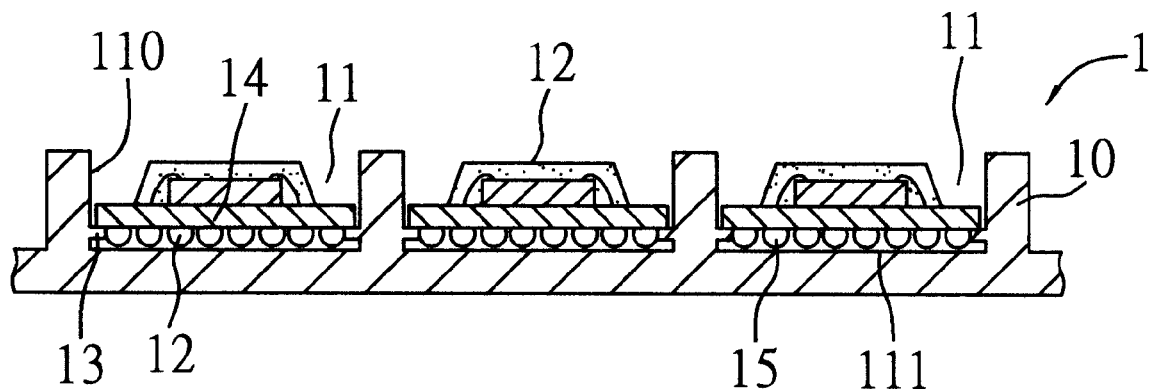
FIG. 5A (PRIOR ART) is a cross-sectional view of a conventional tray for semiconductor packages.
Figure 5B:
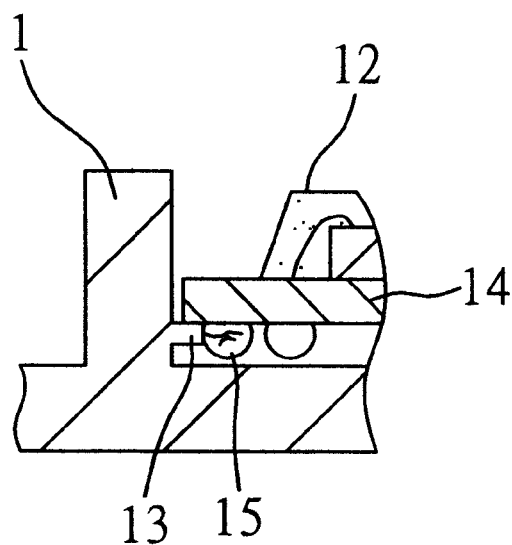
FIG. 5B (PRIOR ART) is a cross-sectional view of a semiconductor package accommodated by the tray shown in FIG. 5A with cracks of solder balls.

As shown in FIG. 4C, a ball-implanting area 242 bonded with solder balls 28 of a semiconductor package 23" accommodated in the tray 2" is situated at a peripheral portion and a central cross portion of a lower surface 241 of a chip carrier 24 of the semiconductor package 23", so as to form a plurality of non-ball-implanting areas 243 free of the solder balls 28 (4 areas shown in the drawing), allowing a plurality of protruding portions 21 (4 protruding portions shown in FIG. 4B) to be formed on a bottom surface 203 of each recessed cavity 202 of the tray 2" and respectively correspond in position to the plurality of non-ball-implanting areas 243 to thereby come into contact with the semiconductor package 23". Moreover, an opening 29 penetrating through the body 20 may be formed on the bottom surface 203 of the recessed cavity 202 and correspond in position to the central ball-implanting area 242 of the semiconductor package 23' to thereby partly expose the solder balls 28.

In the use of the above tray for storage and transportation of a plurality of semiconductor packages, the semiconductor packages are respectively received in recessed cavities of the tray, with non-ball-implanting areas thereof free of solder balls being supported by protruding portions formed on bottom surfaces of the recessed cavities; this does not require the use of flanges formed on an inner side wall of a recessed cavity of a conventional tray to support a quite narrow peripheral portion of a chip carrier (such as a substrate) of a semiconductor package received in the recessed cavity, thereby preventing cracks of solder balls being abutted and pressed by the flanges. Therefore, structural integrity and electrical-connection quality of the semiconductor packages can be assured through the use of the above tray for accommodating the semiconductor packages. Moreover, when the trays are vertically stacked, a positioning portion of an upper tray is engaged with a gap between an inner side wall of a recessed cavity and a semiconductor package received in the recessed cavity of a lower tray, so as to securely position the semiconductor packages accommodated by the lower tray without the occurrence of positional shift or dislocation of the semiconductor packages that may adversely affect performance of subsequent fabrication processes, and also prevent the semiconductor packages from being damaged by unsatisfactory positioning.

The invention has been described using exemplary preferred embodiments. However, it is to be understood that the scope of the invention is not limited to the disclosed embodiments. On the contrary, it is intended to cover various modifications and similar arrangements, such as different numbers and shapes of the protruding portions, different forming positions of the openings, etc. The scope of the claims, therefore, should be accorded the broadest interpretation so as to encompass all such modifications and similar arrangements.

What is claimed is:

1. A tray for ball grid array (BGA) semiconductor packages, with a surface of a BGA semiconductor package being defined with a ball-implanting area where a plurality of solder balls are array-arranged and a non-ball-implanting area free of the solder balls, the tray comprising:

a body having an upper surface and a lower surface opposed to the upper surface, the upper surface being formed with a plurality of downwardly recessed cavities, for allowing the semiconductor packages to be received in the recessed cavities with the surfaces of the semiconductor packages having the solder balls facing toward bottom surfaces of the recessed cavities; and at least a protruding portion formed on the bottom surface of each of the recessed cavities, and corresponding in position to the non-ball-implanting area of the surface of the corresponding semiconductor package, so as to allow the protruding portion to support the semiconductor package received in the corresponding recessed cavity.

2. The tray for BGA semiconductor packages of claim 1, further comprising: at least a positioning portion formed on the lower surface of the body, and corresponding in position to a gap between an inner side wall of each of the recessed cavities and the semiconductor package received in the corresponding recessed cavity, such that when the trays incorporated with the semiconductor packages are vertically stacked, a positioning portion of an upper tray is engaged with a gap between an inner side wall of a recessed cavity and a semiconductor package received in the recessed cavity of a lower tray, so as to securely position the semiconductor package accommodated by the lower tray.

3. The tray for BGA semiconductor packages of claim 1, wherein the ball-implanting area is situated at a peripheral portion of the surface of the semiconductor package, and the non-ball-implanting area is situated at a central portion of the surface, allowing the protruding portion to be formed at a central portion on the bottom surface of the recessed cavity.

4. The tray for BGA semiconductor packages of claim 1, wherein the ball-implanting area is situated at peripheral and central portions of the surface of the semiconductor package, and the non-ball-implanting area is situated between the peripheral and central portions of the surface to be substantially of a frame shape, allowing the protruding portion formed on the bottom surface of the recessed cavity to correspond in position to the frame-shaped non-ball-implanting area.

5. The tray for BGA semiconductor packages of claim 1, wherein the recessed cavity is dimensioned sufficiently to receive the entire semiconductor package therein.

6. The tray for BGA semiconductor packages of claim 1, wherein the protruding portion is greater in height than the solder ball.

7. The tray for BGA semiconductor packages of claim 1, wherein the recessed cavity is greater in depth than the sum in height of the semiconductor package and the protruding portion.

8. The tray for BGA semiconductor packages of claim 1, wherein the body is formed with at least an opening penetrating through the same.

9. A tray for ball grid array (BGA) semiconductor packages, with a surface of a BGA semiconductor package being defined with a ball-implanting area where a plurality of solder balls are array-arranged and a non-ball-implanting area free of the solder balls, the tray comprising:

a body having an upper surface and a lower surface opposed to the upper surface, the upper surface being formed with a plurality of downwardly recessed cavities, for allowing the semiconductor packages to be received in the recessed cavities with the surfaces of the semiconductor packages having the solder balls facing toward bottom surfaces of the recessed cavities; and a plurality of protruding portions formed on the bottom surface of each of the recessed cavities, and corresponding in position to the non-ball-implanting area of the surface of the corresponding semiconductor package, so as to allow the protruding portions to support the semiconductor package received in the corresponding recessed cavity.

10. The tray for BGA semiconductor packages of claim 9, further comprising: at least a positioning portion formed on the lower surface of the body, and corresponding in position to a gap between an inner side wall of each of the recessed cavities and the semiconductor package received in the corresponding recessed cavity, such that when the trays incorporated with the semiconductor packages are vertically stacked, a positioning portion of an upper tray is engaged with a gap between an inner side wall of a recessed cavity and a semiconductor package received in the recessed cavity of a lower tray, so as to securely position the semiconductor package accommodated by the lower tray.

11. The tray for BGA semiconductor packages of claim 9, wherein the ball-implanting area is situated at peripheral and central portions of the surface of the semiconductor package, and the non-ball-implanting area is situated between the peripheral and central portions of the surface, allowing the protruding portions formed on the bottom surface of the recessed cavity to correspond in position to the non-ball-implanting area between the peripheral and central portions of the surface of the semiconductor package.

12. The tray for BGA semiconductor packages of claim 9, wherein the recessed cavity is dimensioned sufficiently to receive the entire semiconductor package therein.

13. The tray for BGA semiconductor packages of claim 9, wherein the protruding portion is greater in height than the solder ball.

14. The tray for BGA semiconductor packages of claim 9, wherein the recessed cavity is greater in depth than the sum in height of the semiconductor package and the protruding portion.

15. The tray for BGA semiconductor packages of claim 9, wherein the body is formed with at least an opening penetrating through the same.

* * * * *